United States Patent
Meiser et al.

(10) Patent No.: US 10,084,441 B2
(45) Date of Patent: Sep. 25, 2018

(54) ELECTRONIC SWITCHING AND REVERSE POLARITY PROTECTION CIRCUIT

(71) Applicant: Infineon Technologies Dresden GmbH, Dresden (DE)

(72) Inventors: Andreas Meiser, Sauerlach (DE); Markus Winkler, Munich (DE)

(73) Assignee: Infineon Technologies Dresden GMBH, Dresden (DE)

( * ) Notice: Subject to any disclaimer, the term of this patent is extended or adjusted under 35 U.S.C. 154(b) by 0 days.

(21) Appl. No.: 15/380,445

(22) Filed: Dec. 15, 2016

(65) Prior Publication Data

US 2018/0175846 A1    Jun. 21, 2018

(51) Int. Cl.
*H03K 3/00* (2006.01)
*H03K 17/081* (2006.01)
*H01L 25/065* (2006.01)
*H01L 27/07* (2006.01)
*H01L 23/00* (2006.01)

(52) U.S. Cl.
CPC ....... *H03K 17/08104* (2013.01); *H01L 24/08* (2013.01); *H01L 25/0657* (2013.01); *H01L 27/0727* (2013.01); *H01L 2224/08145* (2013.01); *H01L 2225/06524* (2013.01)

(58) Field of Classification Search
CPC .............................................. H03K 17/08104
See application file for complete search history.

(56) References Cited

U.S. PATENT DOCUMENTS

| | | | |
|---|---|---|---|
| 6,600,182 B2 | 7/2003 | Rumennik | |
| 7,732,929 B2 | 6/2010 | Otremba et al. | |
| 8,853,776 B2 | 10/2014 | Hirler et al. | |
| 2004/0145013 A1* | 7/2004 | Pfirsch | H01L 29/0634 257/335 |
| 2007/0052058 A1 | 3/2007 | Hirler et al. | |
| 2013/0063116 A1 | 3/2013 | Sun et al. | |
| 2014/0231928 A1 | 8/2014 | Willmeroth et al. | |
| 2015/0270703 A1 | 9/2015 | Reiter et al. | |

FOREIGN PATENT DOCUMENTS

| | | |
|---|---|---|
| CN | 202856704 U | 4/2013 |
| DE | 19902462 A1 | 8/2000 |
| DE | 102005055761 A1 | 5/2007 |

OTHER PUBLICATIONS

Yang et al., "NexFET Generation 2, New Way to Power," Electron Devices Meeting (IEDM 11-583-11-586), Dec. 5-7, 2011, pp. 26.1.1-26.1.4.
Application DE 102016112162.2, by Rainald Sander, filed on Jul. 4, 2016.

* cited by examiner

*Primary Examiner* — Daniel Puentes
(74) *Attorney, Agent, or Firm* — Shumaker & Sieffert, P.A.

(57) ABSTRACT

An electronic circuit includes a first transistor device and a second transistor device of the same conductivity type. The first transistor device is integrated in a first semiconductor body and includes a first load pad at a first surface of the first semiconductor body and a second load pad at a second surface of the first semiconductor body. The second transistor device is integrated in a second semiconductor body and includes a first load pad at a first surface of the second semiconductor body, and a second load pad at a second surface. The first load pad of the second transistor device is mounted to the first load pad of the first transistor device and the second load pad of the first transistor device is mounted to an electrically conducting carrier.

20 Claims, 8 Drawing Sheets

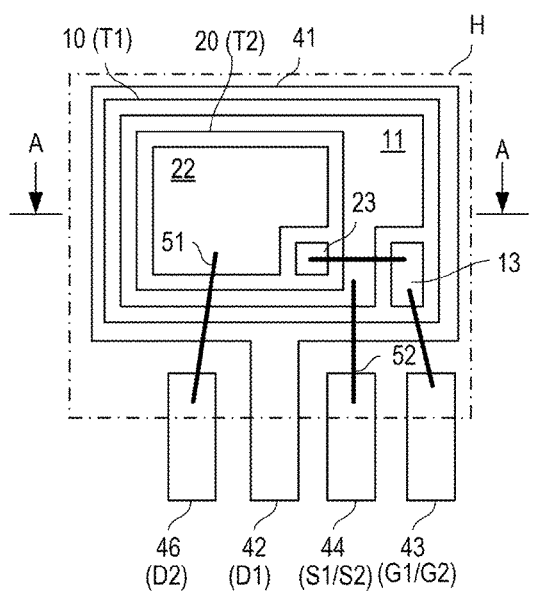
FIG 6
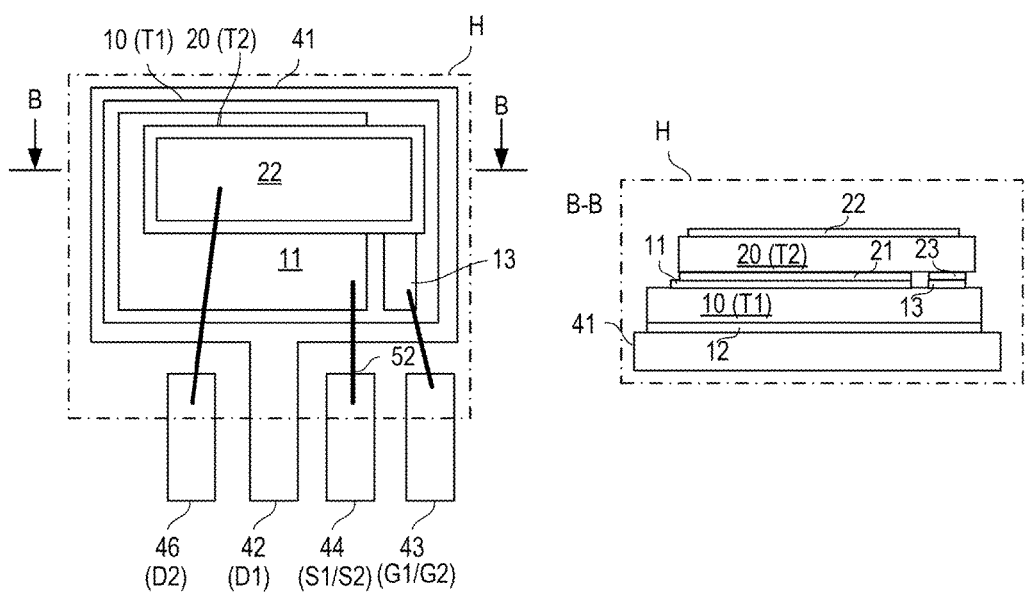 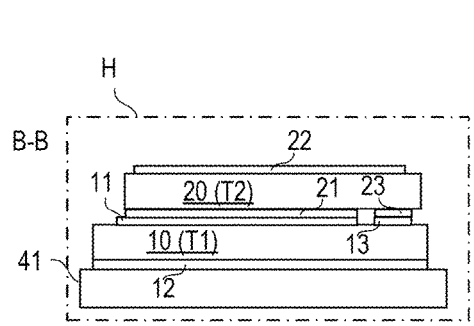
FIG 7A                                   FIG 7B

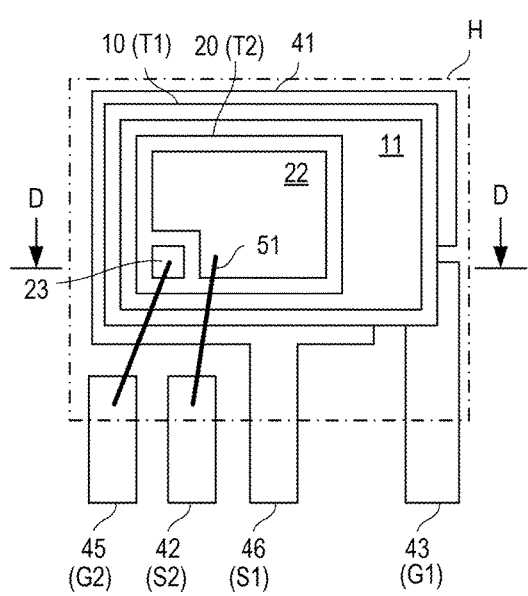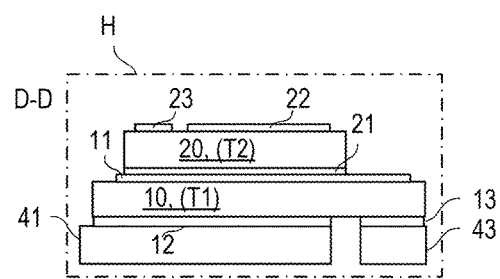
FIG 18A
FIG 18B

ELECTRONIC SWITCHING AND REVERSE POLARITY PROTECTION CIRCUIT

This disclosure in general relates to an electronic circuit, in particular an electronic switching and reverse polarity protection circuit.

Field-effect controlled transistor devices such as MOSFETs (Metal Oxide Field-Effect Transistors) are widely used as electronic switches in different types of applications such as automotive, industrial, household, or consumer electronic applications. A MOSFET is a voltage controlled device that includes a control node and a load path between two load nodes, and switches on or off dependent on a drive voltage received between the control node and one of the load nodes. Usually, the control node is referred to as gate node, the load nodes are referred to as drain node and source node, respectively, and the voltage that controls the MOSFET is referred to as gate-source voltage. A MOSFET usually includes an internal diode (often referred to as body diode) between the two load nodes. Due to this diode the MOSFET can be switched on and off by the drive voltage only if a load path voltage applied between the load nodes has a polarity that reverse biases the internal diode. If the load path voltage forward biases the internal diode the MOSFET conducts a current independent of the drive voltage.

There is a need to provide an integrated circuit that is capable of switching off dependent on a drive voltage and independent of a polarity of a load path voltage.

One embodiment relates to an electronic circuit. The electronic circuit includes a first transistor device and a second transistor device of the same conductivity type. The first transistor device is integrated in a first semiconductor body and includes a first load pad at a first surface of the first semiconductor body and a second load pad at a second surface of the first semiconductor body. The second transistor device is integrated in a second semiconductor body and includes a first load pad at a first surface of the second semiconductor body, and a second load pad at a second surface. The first load pad of the second transistor device is mounted to the first load pad of the first transistor device and the second load pad of the first transistor device is mounted to an electrically conducting carrier. Further, the first load pad of the first transistor device is connected to a first load node of the first transistor device and the first load pad of the second transistor device is connected to a first load node of the second transistor device.

Examples are explained below with reference to the drawings. The drawings serve to illustrate certain principles, so that only aspects necessary for understanding these principles are illustrated. The drawings are not to scale. In the drawings the same reference characters denote like features.

FIG. 6 shows a modification of the semiconductor chip arrangement shown in FIGS. 4A and 4B;

FIGS. 7A and 7B show a top view and a vertical cross sectional view, respectively, of an example semiconductor chip arrangement that includes the electronic circuit shown in FIG. 1;

FIGS. 18A and 18B illustrate one example of how the first transistor device and the second transistor device may be implemented.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
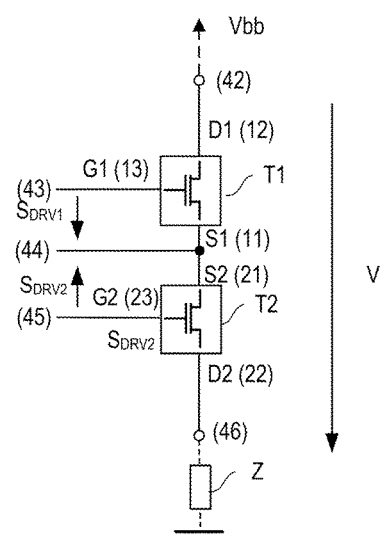
FIG. 1 shows a circuit diagram of an electronic circuit with a first transistor device and a second transistor device.

FIG. 1 shows an electronic circuit diagram of an electronic circuit according to one example. The electronic circuit includes a first transistor device T1 and a second transistor device T2 of the same conductivity type. The first transistor device T1 includes a control node G1, a first load node S1, and a second load node D1 and is configured to switch on or off dependent on a first drive voltage $V_{GS1}$ applied between the control node G1 and the first load node S1. The second transistor device T2 includes a control node G2, a first load node S2, and a second load node D2 and is configured to switch on or off dependent on a second drive voltage $V_{GS2}$ applied between the control node G2 and the first load node S2. The first load node S1 of the first transistor device T1 is connected to the first load node S2 of the second transistor device T2. The first drive voltage $V_{GS1}$ and the second drive voltage $V_{GS2}$ may be generated by a drive circuit (not shown in FIG. 1) and are referenced to the circuit node to which the first load node S1 of the first transistor device T1 and the first load node S2 of the second transistor device T2 are connected. This circuit node is referred to as common source node in the following.

Each of the first transistor device T1 and the second transistor device T2 includes a load path between the respective second load node D1, D2 and the respective first load node S1, S2. The load paths of the first transistor device T1 and the second transistor device T2 form a series circuit as the first transistor device T1 and the second transistor device T2 are connected at their respective first load nodes S1, S2.

The electronic circuit shown in FIG. 1 can be operated as an electronic switch. For this, the series circuit formed by the first transistor device T1 and the second transistor device T2 may be connected in series with a load Z, wherein the series circuit with the first transistor device T1, the second transistor device T2, and the load Z is connected between a first supply node, where a first supply potential Vbb is available, and a second supply mode, where a second supply potential GND is available. According to one example, the second supply potential GND is lower than the first supply potential. The second supply potential GND may be ground. A voltage between the first supply node and the second supply node is referred to as supply voltage V in the following.

Each of the first transistor device T1 and the second transistor device T2 can be operated in an on-state or an off-state. In the on-state, each of the transistor devices T1, T2 is configured to conduct a current when a voltage of any polarity is applied between the first load node D1, D2 and the second load node S1, S2. In the off-state, a capability to block, that is, to prevent a current flow, may be dependent on a polarity of a voltage applied between the second load node D1, D2 and the first load node S1, S2. Some types of transistor devices (such as MOSFETs explained further below) block only if a drive signal received at the control node switches the transistor device off and if a voltage applied between the second load node and the first load node has a first polarity, while they conduct independent of the drive signal received at the control node if the voltage between the second load node and the first load node has a second polarity opposite the first polarity. In the electronic circuit shown in FIG. 1, by virtue of having first and second transistor devices T1, T2 of the same conductivity type and by having the first and second transistor device T1, T2 oriented in the series circuit such that the first load nodes S1, S2 are connected, at least one of the first and second transistor devices T1, T2 blocks independent of a polarity of the supply voltage V if both transistor devices T1, T2 are driven in the off-state.

According to one example, each of the first transistor device T1 and the second transistor device T2 are driven in the on-state or the off-state dependent on an input signal (not shown in FIG. 1). The electronic circuit is in the on-state if both transistor devices are driven in the on-state by the input signal. Further, the electronic circuit is in the off-state if both transistor devices T1, T2 are in the off-state so that, referring to the above, at least one of the two transistor devices T1, T2 blocks.

According to another example, the electronic circuit is operated as a reverse polarity protected electronic switch. In this case, one of the first transistor device T1 and the second transistor device T2 is driven dependent on a polarity of the supply voltage V and the other one of the first transistor device T1 and the second transistor device T2 is driven dependent on the input signal (not shown in FIG. 1). The transistor device driven dependent on the polarity of the supply voltage V may be referred to as reverse polarity protection device and the other transistor device may be referred to as switch device. The reverse polarity protection device may be switched on if the supply voltage V has a first polarity and may be switched off if the supply voltage V has a second polarity opposite the first polarity, wherein the reverse polarity protection device is configured to block in the off-state when the supply voltage has the second polarity, and the switch device is configured to block in the off-state when the supply voltage has the first polarity. The electronic circuit operated as a reverse polarity protected circuit conducts a current if the switch device is driven in the on-state and the supply voltage has the first polarity and blocks if the switch device is in the off-state or the supply voltage V has the second polarity. According to one example, the supply voltage V has the first polarity if the first supply potential Vbb is positive and the second supply potential GND is negative or ground.

There are certain environments in which the maximum magnitude of the supply voltage with the first polarity is higher than the maximum magnitude of the supply voltage with the second polarity. In an automotive electric system, for example, the supply voltage may be provided by a car battery supplying a voltage of 12V. When the battery is correctly connected the supply voltage has the first polarity and the load Z can be switched on and off by switching the electronic circuit that acts as a reverse polarity protected switch. In the off-state and when the voltage has the first polarity, the first transistor device T1 blocks the voltage applied across the electronic circuit. Due to parasitic effects when switching off the electronic circuit voltage spikes may occur that are higher than the supply voltage provided by the battery. According to one example, the voltage blocking capability of the first transistor device T1 is higher than the supply voltage so as to withstand those voltage spikes. In the reverse polarity case, however, the electronic circuit never does not switch on so that voltage spikes when switching off do not occur. Thus, the voltage blocking capability of the second transistor device T2, which blocks in the reverse polarity case, may be lower than the voltage blocking capability of the first transistor device T1. A lower voltage blocking capability of the second transistor device T2 as compared with the voltage blocking capability of the first transistor device may be associated with a lower size of a semiconductor body in which the second transistor device is integrated as compared with the size of a semiconductor body in which the first transistor device is integrated.

According to one example, the first supply potential Vbb is positive and the second supply potential GND is negative or ground. In the example shown in FIG. 1, the electronic circuit is depicted as a high-side switch. In this case, the series circuit with the first transistor device T1 and the second transistor device T2 is connected between the load Z and the first supply node (Vbb), and the load is connected between the series circuit and the second supply node (GND). This, however, is only an example. According to another example (not shown) the load is connected between the electronic circuit and the first supply node Vbb so that the electronic circuit operates as a low-side switch.

The first transistor device T1 and the second transistor device T2 have the same conductivity type. According to one example, the first transistor device T1 and the second transistor device T2 are transistor devices of the same type, such as a MOSFET (Metal Oxide Semiconductor Field-Effect Transistor), BJT (Bipolar Junction Transistor), JFET (Junction Field-Effect Transistor), or the like.

Figure 2:
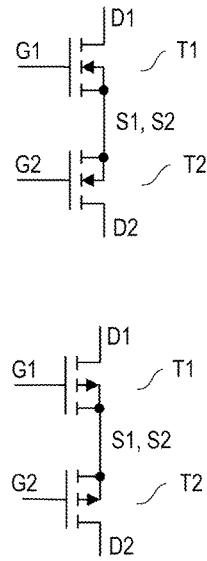
FIG. 2 illustrates one example of how the first transistor device and the second transistor device may be implemented.

According to one example shown in FIG. 2, the conductivity type is an n-type and the transistor device is a MOSFET so that each of the first transistor device T1 and the second transistor device T2 is implemented as an n-type MOSFET. In this case, the respective control node G1, G2 is a gate node, the respective first load node S1, S2 is a source node, and the respective second load node D1, D2 is a drain node. FIG. 2 shows circuit symbols of n-type MOSFETs. In this example, the n-type MOSFETs are drawn as enhancement MOSFETs. This, however, is only an example. According to another example (not shown), the n-type MOSFETs are depletion MOSFETs. According to yet another example, one of the first transistor device T1 and the second transistor device T2 is an n-type enhancement MOSFET and the other one of the first transistor device T1 and the second transistor device T2 is an n-type depletion MOSFET. An n-type MOSFET includes an internal body diode between the drain node and the source node that is forward biased when a positive voltage is applied between the source node and the drain node. Thus, an n-type MOSFET, such as one of n-type MOSFETs T1, T2 shown in FIG. 2, is configured to block only when a voltage is applied between the drain node D1, D2 and the source node S1, S2 that reverse biases the internal body diode and when the MOSFET is switched off by receiving a suitable drive signal at the respective gate node.

Figure 3:
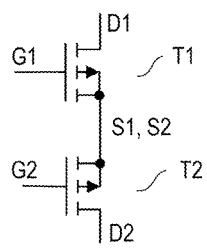
FIG. 3 shows another example of how the first transistor device and the second transistor device may be implemented.

According to another example shown in FIG. 3, the conductivity type is a p-type and the transistor device is a MOSFET so that each of the first transistor device T1 and the second transistor device T2 is implemented as a p-type MOSFET. In this case, the respective control node G1, G2 is a gate node, the respective first load node S1, S2 is a source node, and the respective second load node D1, D2 is a drain node. FIG. 3 shows circuit symbols of p-type MOSFETs. In this example, the p-type MOSFETs are drawn as enhancement MOSFETs. This, however, is only an example. According to another example (not shown), the p-type MOSFETs are depletion MOSFETs. According to yet another example, one of the first transistor device T1 and the second transistor device T2 is a p-type enhancement MOSFET and the other one of the first transistor device T1 and the second transistor device T2 is a p-type depletion MOSFET. An p-type MOSFET includes an internal body diode between the drain node and the source node that is forward biased when a negative voltage is applied between the source node and the drain node. Thus, a p-type MOSFET, such as one of p-type MOSFETs T1, T2 shown in FIG. 3, is configured to block only when a voltage is applied between the drain node D1, D2 and the source node S1, S2 that reverse biases the internal body diode and when the MOSFET is switched off by receiving a suitable drive signal at the respective gate node.

Figure 4A:
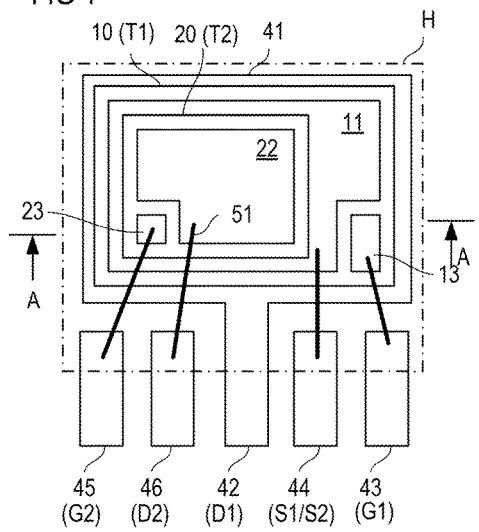
FIGS. 4A and 4B show a top view and a vertical cross sectional view, respectively, of an example semiconductor chip arrangement that includes the electronic circuit shown in FIG. 1.
Figure 4B:
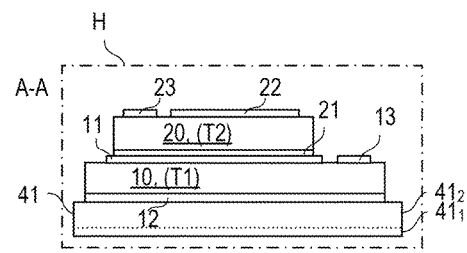

FIGS. 4A and 4B show one example of the electronic circuit shown in FIG. 1 on a package level. That is, FIGS. 4A and 4B show an example semiconductor arrangement (semiconductor package) that includes the electronic circuit shown in FIG. 1. FIG. 4A shows a top view of the semiconductor arrangement, and FIG. 4B shows a vertical cross sectional view in a section plane A-A. Referring to FIGS. 4A and 4B, the semiconductor arrangement includes a first semiconductor body (which may also be referred to as first semiconductor die or first semiconductor chip) 10 in which the first transistor device T1 is integrated and a second semiconductor body (which may also be referred to as second semiconductor die or second semiconductor chip) 20 in which the second transistor device T2 is integrated. Although the term semiconductor body or semiconductor die is used to denote the arrangement in which one transistor device is integrated, this arrangement does not only include a monocrystalline semiconductor material, but may also include electrically conducting lines and layers, electrically insulating layers, passivation layers, and the like.

Referring to FIGS. 4A and 4B, the first semiconductor body 10 includes a first load pad 11 and a control pad 13 at a first surface, and a second load pad 12 at a second surface opposite the first surface of the semiconductor body. The first load pad 11 forms the first load node S1, the second load pad 12 forms the second load node D1, and the control pad 13 forms the control node G1 of the first transistor device T1. The second semiconductor body 20 includes a first load pad 21 at a first surface, and a second load pad 22 and a control pad 23 at a second surface opposite the first surface. The first load pad 21 forms the first load node S2, the second load pad 22 forms the second load node D2, and the control pad 23 forms the control node G2 of the second transistor device T2. In FIG. 1, reference characters in brackets next to the reference characters of the individual circuit nodes of the first and second transistor device T1, T2 denote the reference characters shown in FIG. 4A of the pads that form the respective circuit nodes.

Referring to FIGS. 4A and 4B, the second load pad 12 of the first transistor device T1 integrated in the first semiconductor body 10 is mounted to an electrically conducting carrier 41, and the first load pad 21 of the second transistor device T2 integrated in the second semiconductor body 20 is mounted to the first load pad 11 of the first transistor device T1. This mounting may include at least one of soldering, welding, and gluing (using an electrically conducting glue), so as to physically mount and electrically connect the second load pad 12 of the first transistor device T1 to the carrier 41 and the first load pad 21 of the second transistor device T2 to the first load pad 11 of the first transistor device T1. FIG. 4B is a schematic representation of the semiconductor arrangement so that connection layers, such as a solder layer or a glue, between the carrier 41 and the second load pad 12 of the first transistor device T1 and between the first load pads are not shown.

The electrically conducting carrier 41 can be comprised of an electrically conducting material as a whole. Alternatively (as illustrated in dotted lines in FIG. 4B), the carrier 41 includes an electrically insulating layer $41_1$ and an electrically conducting layer $41_2$ on the insulating layer $41_1$, wherein the second load pad 12 of the first transistor device T1 is mounted to the electrically conducting layer $41_2$.

Referring to FIGS. 2 and 3, the first transistor device T1 and the second transistor device T2 may each be implemented as a MOSFET. In this case, the first load pad 11 of the first transistor device T1 forms the source node S1, and the first load pad 21 of the second transistor device T2 forms the source node S2 of the second transistor device T2. In this case, the first transistor device T1 may be implemented as drain-down MOSFET that has the source pad 11 and the gate pad 13 at a first surface and the drain pad 12 at a second surface opposite the first surface of the semiconductor body 10 in which it is integrated. The second transistor T2 device may be implemented as a source-down MOSFET that has the source pad 11 at a first surface and the drain pad 22 and the gate pad 23 at a second surface opposite the first surface of the semiconductor body 20 in which it is integrated.

Referring to FIG. 4A, the second semiconductor body 20 is smaller than the first load pad 11 of the first transistor device T1 so that parts of the first load pad 11 are not covered by the second semiconductor body 20. Further, the control pad 13 of the first transistor device T1 is not covered by the second semiconductor body 20.

Referring to FIGS. 4A and 4B, the semiconductor arrangement may further include a housing H (illustrated in dashed and dotted lines in FIGS. 4A and 4B). This housing H, which may also be referred to as package, surrounds the semiconductor bodies 10, 20 and the carrier 41. Electrically conducting legs 42-46 protrude from the housing. These legs 42-46 are connected to load pads and control pads of the first and second transistor device T1, T2 in the way explained below. Each of these legs forms a control pin or load pin of the electronic circuit, wherein a control pin is connected to a control pad and a load pin is connected to a load pad. Using these control and load pins the electronic circuit can be connected to a drive circuit that generates the drive signals, to a load and to a supply node, for example. In FIG. 4A, the reference characters of the control nodes and load nodes connected to the respective control and load pins are given in brackets. Equivalently, in FIG. 1, the reference characters of the control and load pins connected to the respective control and load nodes are given in brackets.

Referring to FIG. 1, leg 42 is electrically connected to the carrier 41 which is electrically connected to the second load pad 12 of the first transistor device T1; leg 46 is electrically connected to the second load pad 22 of the second transistor device T2; leg 44 is electrically connected to the first load pad 11 of the first transistor device T1 in a region not covered by the second semiconductor body 20 and, via the first load pad 11 of the first transistor device T1, is also electrically connected to the first load pad 21 of the second transistor device T2; leg 43 is electrically connected to the control pad 13 of the first transistor device T1; and leg 45 is electrically connected to the control pad 23 of the second transistor device T2. In the following, leg 42 is also referred to as first load pin, leg 46 is also referred to as second load pin, leg 43 is also referred to as first control pin, leg 45 is also referred to as second control pin, and leg 44 is also referred to as third control pin of the electronic circuit.

Figure 5A:
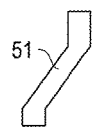
FIGS. 5A and 5B show different examples of how a connection line illustrated in FIG. 4A may be implemented.
Figure 5B:

In FIG. 4A, the bold lines between pads and legs represent electrically conducting connections. These connections can be implemented in different ways. Just for the purpose of explanation, FIGS. 5A and 5B show one of these connections in greater detail, namely the connection 51 between the second load pad 22 of the second transistor device T2 and the respective leg 46. In the example shown in FIG. 5A, this connection 51 is implemented as a flat conductor that has been cut from a metal sheet. According to another example, shown in FIG. 5B, this connection is implemented as a bond wire. Each of the other connections shown in FIG. 4A but not labeled with a reference character can either be implemented as a flat conductor or as a bond wire.

Mounting the first load pad 21 of the second transistor device T2 to the first load pad 11 of the first transistor device T1 provides for a low ohmic resistance between the load paths of the first transistor device T1 and the second transistor device T2. According to one example, the first load pin 42 is an integral part of the carrier 41 which results in a low ohmic resistance between the first load pin 42 and the second load pad 12 of the first transistor device T1. A low ohmic resistance between the second load pad 22 of the second transistor device T2 and the second load pin 46 may be obtained by implementing the connection 51 with a flat conductor or a thick bond wire. In this way, in the on-state of the first and the second transistor devices T1, T2, there is a low ohmic resistance along the overall load path of the electronic circuit, wherein the overall load path is formed by the load paths of the first and second transistor devices T1, T2. Further, mounting the second semiconductor body 20 on the first semiconductor body 10 results in a small size of the overall semiconductor arrangement.

FIG. 6 shows a modification of the semiconductor arrangement shown in FIGS. 4A and 4B. In the example shown in FIG. 6, the control pad 23 of the second transistor device T2 is electrically connected to the control pad 13 of the first transistor device T1. Thus, both the first transistor device T1 and the second transistor device T2 receive the same drive signal. Both the control pad 23 of the second transistor device T2 and the control pad 13 of the first transistor device T1 are connected to leg 43 which forms a common control pad of the electronic circuit in this example.

FIGS. 7A and 7B show a top view and a vertical cross-sectional view, respectively, of a semiconductor arrangement according to another example. This semiconductor arrangement is based on the semiconductor arrangement shown in FIG. 6 and is different from the semiconductor arrangement shown in FIG. 6 in that the control pad 23 of the second transistor device T2 is at the first surface of the second semiconductor body 20. This second semiconductor body 20 is mounted to the first semiconductor body 10 such that the first load pad 21 of the second transistor device T2 is mounted to the first load pad 11 on the first transistor device T1 and the control pad 23 of the second transistor device T2 is mounted to the control pad 13 of the first transistor device T1. The second semiconductor body 20 does not completely cover the first load pad 11 of the first transistor device T1 and the control pad 13 of the first transistor device T1. A section of the first load pad 11 not covered by the second semiconductor body 20 is electrically connected to the leg 44 forming the third control pin and a section of the first control pad 13 not covered by the second semiconductor body 20 is electrically connected to the leg 43 forming the common control pin. This common control pin 43 is connected to the control pad 23 of the second transistor device T2 via the control pad 13 of the first transistor device T1. Equivalently, the third control pin 44 is electrically connected to the first load pad 21 of the second transistor device T2 via the first load pad 11 of the first transistor device T1. In the example shown in FIGS. 7A and 7B, the second transistor device T2 can be implemented as a drain-down MOSFET that has the first load pad 21 and the control pad 23 at a first surface and the second load pad 22 at a second surface of the second semiconductor body 20.

Figure 8:
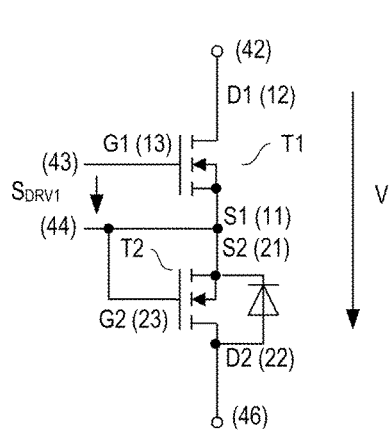
FIG. 8 shows a circuit diagram of another electronic circuit with a first transistor device and a second transistor device.

FIG. 8 shows an electronic circuit according to another example. The electronic circuit shown in FIG. 8 is based on the electronic circuit shown in FIG. 1 and is different from the electronic circuit shown in FIG. 1 in that the control node G2 of the second transistor device T2 is connected to the first load node S2.

In the example shown in FIG. 8, the second transistor device T2 is implemented as a MOSFET. A MOSFET having its control node (gate node) electrically connected to its first load node (source node) can be referred to as MOS Gated Diode (MGD). The second transistor device T2, which is also referred to as second MOSFET in the following, has an internal body diode between the drain node D2 and the source node S2. This body diode is represented by the diode symbol in FIG. 8. In an n-type MOSFET, as shown in FIG. 8, the source node S2 forms an anode and the drain node D2 forms a cathode of this body diode. This body diode is forward biased when the first transistor device T1 is in the on-state and the supply voltage V has a first polarity, and the body diode is reverse biased, independent of the operation state of the first transistor device T1, when the supply voltage V has a second polarity opposite the first polarity. When the body diode of the second transistor device T2 operated as an MGD is forward biased, a conducting channel is generated inside the transistor device T2 in parallel with the body diode. This results in reduced conduction losses and is explained with reference to FIG. 11 herein further below.

Figure 9:
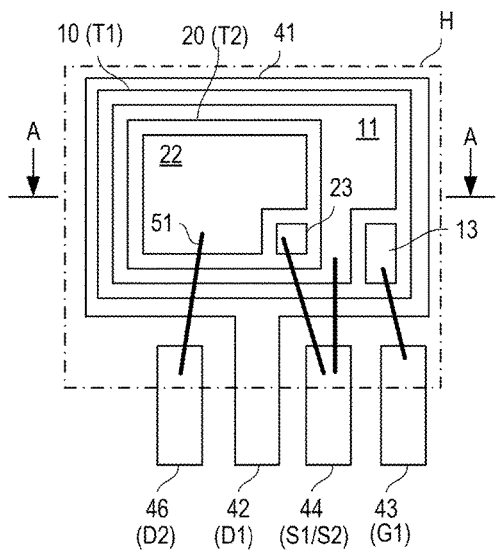
FIG. 9 shows a top view of a semiconductor chip arrangement that includes the electronic circuit shown in FIG. 8.

FIG. 9 shows one example of a semiconductor arrangement that includes an electronic circuit of the type shown in FIG. 8. The semiconductor arrangement shown in FIG. 9 is based on the semiconductor arrangement shown in FIGS. 4A and 4B and is different from the semiconductor arrangement shown in FIGS. 4A and 4B in that the control pad 23 of the second transistor device T2 is electrically connected to the leg 44 that forms the third control pin. This third control pin 44 is further connected to the first load pad 11 of the first transistor device T1 and, via the first load pad 11 of the first transistor device T1, to the first load pad 21 (not shown in FIG. 9) of the second transistor device T2. Additionally or alternatively, the control pad 23 of the second transistor device T2 is electrically connected to the first load pad 11 of the first transistor device T1.

Figure 10A:
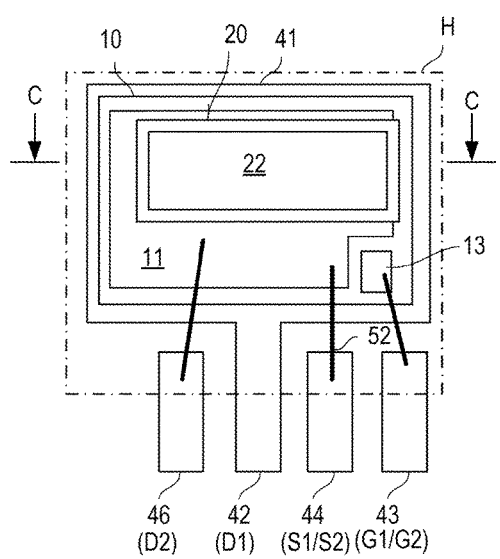
FIGS. 10A and 10B show a top view and a vertical cross sectional view, respectively, of an example semiconductor chip arrangement that includes the electronic circuit shown in FIG. 8.
Figure 10B:
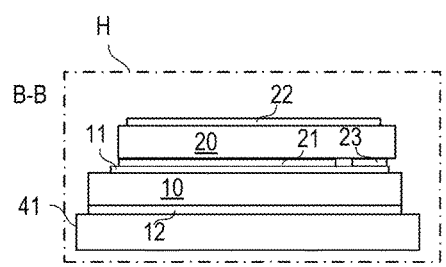

FIGS. 10A and 10B show a top view and a vertical cross-sectional view of a semiconductor arrangement according to another example that includes the electronic circuit shown in FIG. 8. The semiconductor arrangement shown in FIGS. 10A and 10B is based on a semiconductor arrangement shown in FIGS. 7A and 7B and is different from the semiconductor arrangement shown in FIGS. 7A and 7B in that the first load pad 21 and the gate pad 23 of the second transistor device T2 are both mounted to the first load pad 11 of the first transistor device T1, so that the first load pad 11 of the first transistor device 11 electrically connects the first load pad 21 and the control pad 23 of the second transistor device T2.

Figure 11:
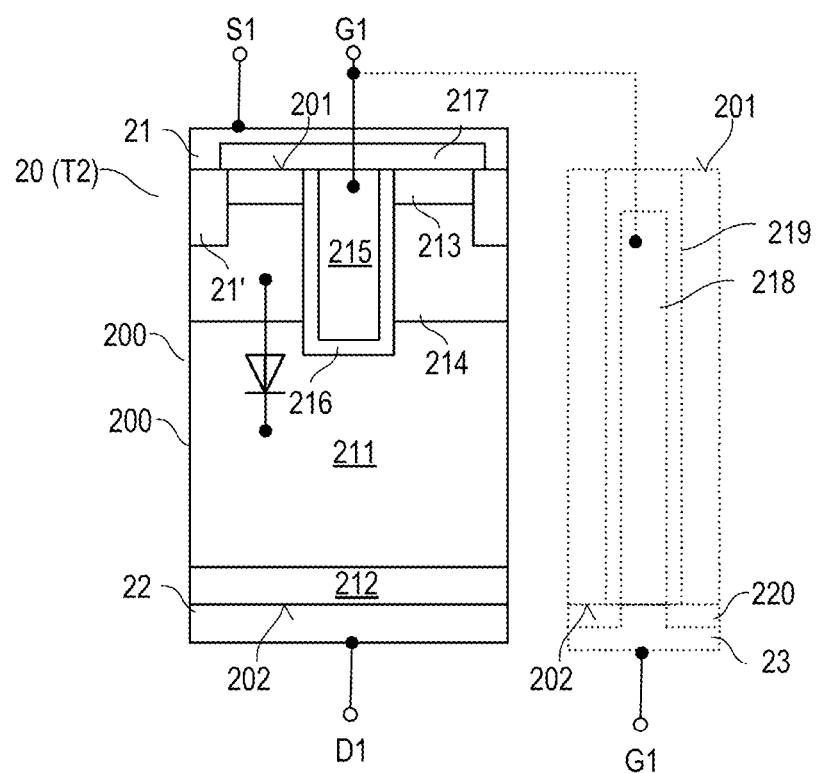
FIG. 11 shows a vertical cross sectional view of the second transistor device according to one example.

FIG. 11 shows a vertical cross-sectional view of the second transistor device T2 according to one example. In particular, FIG. 11 shows a vertical cross sectional view of the second semiconductor body 20 in which the second transistor device T2 is integrated. Referring to FIG. 11, the semiconductor body includes a semiconductor region 200 with a first surface 201 and a second surface 202. This semiconductor region may be comprised of a monocrystalline semiconductor material such as silicon (Si), silicon carbide (SiC), or the like.

In the semiconductor region 200, the transistor device T2 includes a drift region 211, a body region 214 adjoining the drift region 211 and forming a pn-junction with the drift region 211, a source region 213 separated from the drift region 211 by the body region 214, and a drain region 212. The drift region 211 is arranged between the body region 214 and the drain region 212. The second load pad 22 is arranged on the second surface 202 of the semiconductor region 200 and is electrically connected to the drain region 212. The second load pad 22 may also be referred to as drain electrode in this example. The first load pad 21, which may also be referred to as source electrode, is electrically connected to the body region 214 and the source region 213. The source electrode 21 is arranged essentially above the first surface 201 of the semiconductor region 200, but may include electrode sections 21' that extend into the semiconductor region and are electrically connected to the source region 213 and the body region 214. A gate electrode 215 is adjacent the body region 214 and dielectrically insulated from the body region 214 by a gate dielectric 216. In the example shown in FIG. 11, the gate electrode 215 is arranged in a trench that extends from the first surface 201 into the semiconductor region 200. This, however, is only an example. According to another example (not shown) the gate electrode is planar electrode arranged above the first surface.

In a drain-down transistor, there is a gate pad above the first surface 201 and electrically connected to the gate electrode 215. Such gate pad, however, is not illustrated in FIG. 11. In a source-down transistor, the semiconductor region 200 includes a gate via 218 (illustrated in dotted lines in FIG. 11) that is electrically connected to the gate electrode 215 (wherein this electrical connections are only schematically illustrated in FIG. 11) and extends to the second surface 202 where it is electrically connected to the control pad 23, which may also be referred to as gate pad in this example. The gate via 218 is dielectrically insulated from the semiconductor region 200 by a dielectric layer 219. The gate electrode 215 may be electrically insulated from the source electrode 21 by an insulation layer 217. Further, the gate pad 23 may be electrically insulated from the semiconductor region by an insulation layer 220.

In an n-type transistor device, each of the drift region 211, the source region 213 and the drain region 212 is n-doped, while the body region 214 is p-doped. In a p-type transistor, the doping types of the individual device regions are complementary to the doping types of the corresponding device regions in a n-type transistor device. The transistor device includes a body diode that includes a pn-junction between the body region 214 and the drift region 211. The body diode, independent of a gate-source voltage applied between the gate electrode 215 and the source region 213, conducts a current when a voltage is applied between the source node S1 and the drain node D1 that forward biases the pn-junction. In an n-type MOSFET, the body diode conducts when a positive voltage higher than a forward voltage of the body diode is applied between the source node S1 and the drain node D1.

The MOSFET operates as a MGD when the gate node G1 and the source node S1 are electrically connected. In this case, when a voltage is applied between the source node S1 and the drain node D1 that forward biases the body diode a current flows through the body region 214 along the gate dielectric 216. This causes a voltage drop across the body region, whereas this voltage drop is associated with a voltage between the gate electrode 215 and the body region 214. In the body region 214, this voltage increases as a distance to the source region 213 increases. In those regions, where the voltage between the body region 214 and the gate electrode 215 reaches a threshold voltage of the MOSFET a conducting channel is generated along the gate dielectric 216. This conducting channel may help to reduce conduction losses as compared to merely operating the body diode in the conducting state. The threshold voltage is dependent on several parameters such as a thickness of the gate dielectric 216, the material of the gate electrode 215 and the material of the gate dielectric 216 and can be adjusted by suitably adjusting these parameters.

Figure 12:
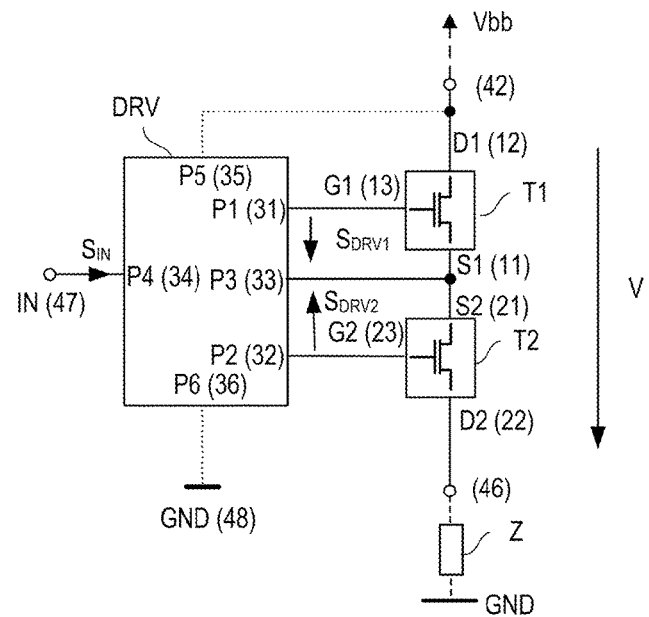
FIG. 12 shows a circuit diagram of an electronic circuit with a first transistor device, a second transistor device, and a drive circuit.

FIG. 12 shows an electronic circuit according to another example. The electronic circuit shown in FIG. 12 is based on the electronic circuit shown in FIG. 1 and additionally includes a drive circuit DRV. According to one example, the drive circuit is configured to drive both the first transistor device T1 and the second transistor device T2 dependent on an input signal $S_{IN}$ received by the drive circuit in order to switch on or off the electronic circuit dependent on the input signal $S_{IN}$. In this case, the electronic circuit conducts a current when the transistors T1, T2 are in the on-state and when a supply voltage V is applied across the series circuit with the transistors T1, T2, and the electronic circuit blocks when the transistors T1, T2 are in the off-state. This conducting or blocking is independent off a polarity of the supply voltage V. According to another example, the drive circuit is configured to operate the electronic circuit as a reverse polarity protected switch, that is, to drive the first transistor device T1 dependent on the input signal $S_{IN}$ and drive the second transistor device T2 dependent on a polarity of the supply voltage V. In other words, the drive circuit DRV is configured to generate the drive signal $S_{DRV1}$ of the first transistor device T1 based on the input signal $S_{IN}$ and generate the drive signal $S_{DRV2}$ of the second transistor device T2 based on a polarity of the supply voltage V.

The drive circuit DRV shown in FIG. 12 includes a first pin P1 coupled to the control node G1 of the first transistor device T1, a second pin P2 coupled to the control node G2 of the second transistor device T2 and a third pin P3 coupled to the first load nodes S1, S2 of the first transistor device T1 and a second transistor device T2. The drive circuit DRV is configured to generate the first drive signal $S_{DRV1}$ as a voltage between the first pin P1 and the third pin P3 and generate the second drive signal $S_{DRV2}$ as a voltage between the second pin P2 and the third pin P3. Pins P1-P3 are referred to as control pins of the drive circuit DRV in the following.

Referring to FIG. 12, the drive circuit DRV further includes an input pin P4 configured to receive the input signal $S_{IN}$. Further, the drive circuit DRV may be configured to receive the supply voltage V between a first supply pin P5 and a second supply pin P6. According to one example, the drive circuit DRV receives the supply voltage to detect the polarity of the supply voltage V and drive the second transistor device T2 accordingly. Additionally or alternatively, the drive circuit DRV may receive the supply voltage V to supply the drive circuit DRV. That is, the drive circuit DRV may be configured to generate a supply voltage for internal circuitry (not shown) of the drive circuit DRV from the supply voltage V.

Figure 13:
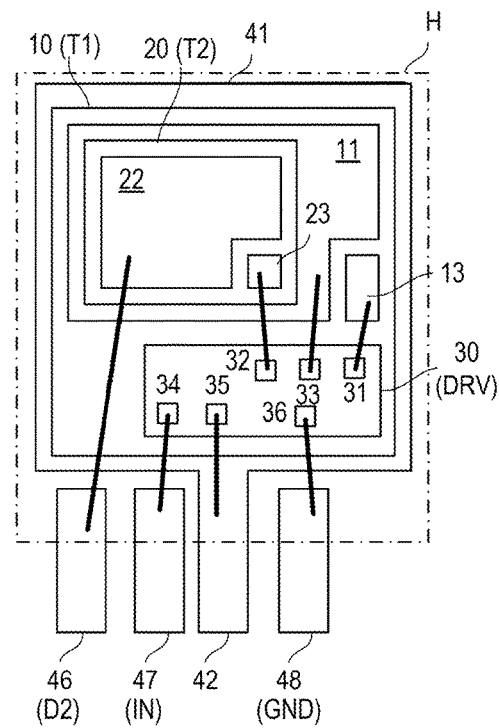
FIG. 13 shows a top view of an example semiconductor chip arrangement that includes the electronic circuit shown in FIG. 12.

FIG. 13 shows one example of a semiconductor arrangement that includes the electronic circuit shown in FIG. 12. This semiconductor arrangement includes a chip-on-chip-arrangement with the first semiconductor body 10 and the second semiconductor body 20 as explained with reference to FIGS. 4A and 4B, to which reference is made. Additionally, to the first semiconductor body 10 and the second semiconductor body 20 the arrangement shown in FIG. 13 includes a third semiconductor body 30 in which the drive circuit DRV is integrated. This third semiconductor body 30 is arranged on the first surface of the first semiconductor body 10 next to the second semiconductor body 20, but is spaced apart from the first load pad 11 and the control pad 13 of the first transistor device T1. The third semiconductor body 30 includes a plurality of contact pads, wherein each of these contact pads forms one of the pins P1-P6 of the drive circuit DRV. In FIG. 12, the reference character of the pad that forms the respective pin is indicated in brackets next to the reference character of the pin. Referring to FIG. 13, a first pad 31, which forms the first pin P1, is electrically connected to the control pad 13 of the first transistor device T1; a second pad 32, which forms the second pin P2, is electrically connected to the control pad 23 of the second transistor device T2; a third pad 33, which forms the third pin P3, is electrically connected to the first load pad 11 of the first transistor device T1; a fourth pad 34, which forms the input pin P4 is electrically connected to a leg 47 that forms an input pin IN of the electronic circuit; a fifth pad 35, which forms the first supply pin P5, is electrically connected to the carrier 41 or the leg 42 connected to the carrier 41 and, therefore, to the second load pad (not visible in FIG. 13) of the first transistor device T1; and a sixth pad 36, which forms the second supply pin P6, is electrically connected to a leg 48, which forms a second supply pin of the electronic circuit. Like in the example explained with reference to FIGS. 4A and 4B, the second load pad 22 of the second transistor device T2 is connected to leg 46.

The chip-on-chip arrangement with the first semiconductor body 10 and the second semiconductor body 20 shown in FIG. 13 is only one example. Any other chip-on-chip arrangement with the first semiconductor body 10 and the second semiconductor body 20 explained herein before can be used in the semiconductor arrangement shown in FIG. 13 as well.

Figure 14:
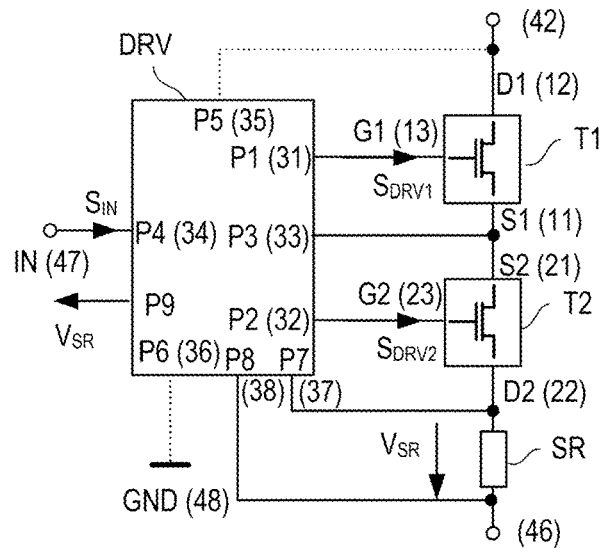
FIG. 14 shows a circuit diagram of a further electronic circuit with a first transistor device, a second transistor device, and a drive circuit.

FIG. 14 shows a modification of the electronic circuit shown in FIG. 12. The electronic circuit shown in FIG. 14 additionally includes a current sense resistor in series with the first transistor device T1 and the second transistor device T2. The drive circuit DRV is coupled to the sense resistor SR via pins P7 and P8 and is configured to sense a voltage across the sense resistor SR. This voltage $V_{SR}$ is proportional to a current flowing through the transistor devices T1, T2. According to one example, the drive circuit DRV is configured to output a current sense signal $S_{SR}$ that represents the sense voltage $V_{SR}$ at another pin P9.

Figure 15:
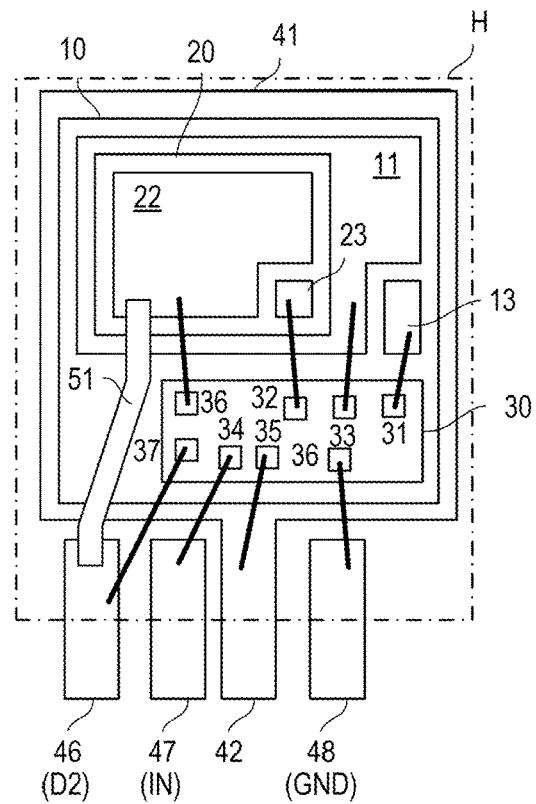
FIG. 15 shows a top view of an example semiconductor chip arrangement that includes the electronic circuit shown in FIG. 12.

FIG. 15 shows a semiconductor arrangement that includes the electronic circuit shown in FIG. 14. This semiconductor arrangement is different from the semiconductor arrangement shown in FIG. 13 in that the drive circuit integrated in the third semiconductor body 30 includes further pads 36 and 37 which represent pins P7 and P8, respectively. One 36 of these pads 36, 37 is connected to the second load pad 22 of the second transistor device T2 and the other one 37 of these pads 36, 37 is connected to leg 46. An electrical connection between the second load pad 22 of the second transistor device T2 and leg 46 acts as the sense resistor SR in this example. According to one example, this electrical connection 51 is formed by a flat conductor.

Figure 16:
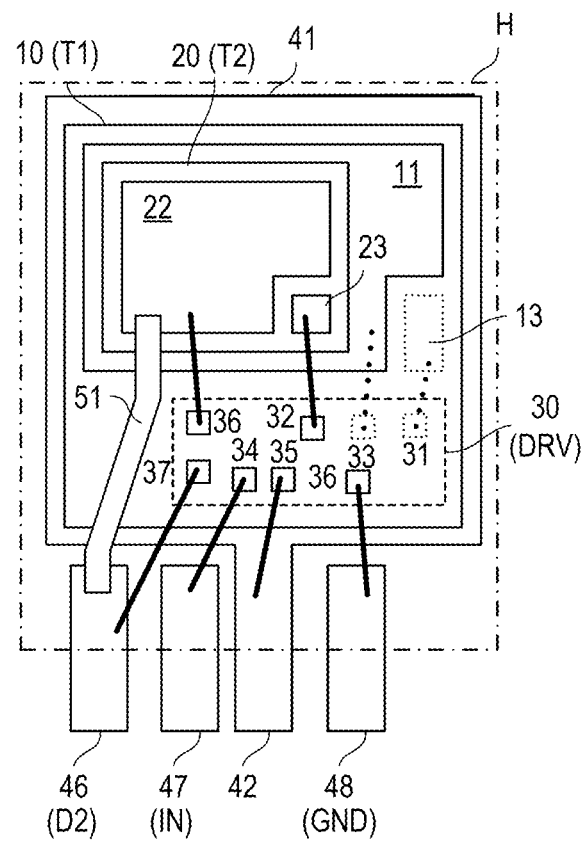
FIG. 16 shows a top view of a further example semiconductor chip arrangement that includes the electronic circuit shown in FIG. 12.

FIG. 16 shows a modification of the semiconductor arrangement shown in FIG. 15. In this example, the drive circuit is monolithically integrated in the first semiconductor body 10. That is, the semiconductor body 30 in which the drive circuit DRV is integrated is an integral part of the first semiconductor body 10.

Figure 17:
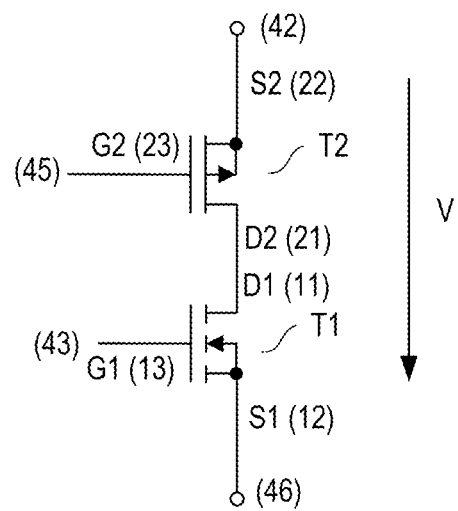
FIG. 17 shows a circuit diagram of a further electronic circuit with a first transistor device and a second transistor device.

FIG. 17 shows another example of an electronic circuit. This electronic circuit is different from the electronic circuits explained above in that the first transistor device T1 and the second transistor device T2 have changed their positions in the series circuit so that the drain nodes D1, D2 of the transistor devices T1, T2 are connected. The drain nodes D1, D2 are the first load nodes and the source nodes S1, S2 are the second load nodes in this example, the gate nodes G1, G2 are the control nodes. The transistor devices are transistor devices of the same type, so that internal body diodes, by virtue of having the second load nodes D1, D2 connected, are connected in a back-to-back configuration. Just for the purpose of illustration, the transistor devices are drawn as n-type enhancement MOSFETs in the example shown in FIG. 17. Similar to the electronic circuit shown in FIG. 8, the second transistor device T2 shown in FIG. 17 may be operated as an MGD by connecting the gate node G and the source node S.

FIGS. 18A and 18B show one example of a semiconductor arrangement that includes the electronic circuit shown in FIG. 17. FIG. 18A shows a top view, and FIG. 18B shows a vertical cross sectional view in a section plane D-D. Like in the semiconductor arrangements explained above, the first transistor device T1 is integrated in a first semiconductor body 10, the second transistor device T2 is integrated in a second semiconductor body 20, the first semiconductor body 10 is mounted on a carrier 41, and the second semiconductor body 20 is mounted on top of the first semiconductor body 10. The semiconductor arrangement shown in FIGS. 18A and 18B is different from the semiconductor arrangements explained above in that the drain node D1 of the first transistor device T1 is connected to the first load pad 11 at the first surface of the first semiconductor body 10, the source node S1 of the first transistor device T1 is connected to the second load pad 12 at the second surface of the first semiconductor body 10, the drain node D2 of the second transistor device T2 is connected to the first load pad 21 at the first surface of the second semiconductor body 20, and the source node S2 of the second transistor device T2 is connected to the second load pad 22 at the second surface of the second semiconductor body 20. Like in the examples explained above, the first load pad 21 of the second semiconductor body 20 is mounted to the first load pad 11 of the first semiconductor body 10 and electrically connected therewith, and the second load pad 12 of the first semiconductor body 10 is mounted to the carrier 41.

The first transistor device T1 and the second transistor device T2 shown in FIGS. 18A and 18B are implemented as drain-down MOSFETs. That is, the first load pad 11 connected to the drain node D1 is the only pad at the first surface of the first semiconductor body 10, and the first load pad 21 connected to the drain node D2 is the only pad at the first surface of the second semiconductor body 20. The second surface of the first semiconductor body 10 that faces the carrier 41 not only includes the second load pad 12 but also the control pad 13. This control pad 13 is mounted to a leg 43 that is spaced apart from the carrier 41 and protrudes from the optional housing. The control pad 23 of the second semiconductor body 20 is connected to a leg 45 via an electrically conducting connection such as a bond wire, and the second load pad 22 of the second semiconductor body 20 is connected to a leg 42 via an electrically conducting connection such as a bond wire or a flat conductor. The carrier may include a leg 46 that protrudes from the housing H.

What is claimed is:

1. An electronic circuit, comprising:
   a first transistor device of a predetermined conductivity type; and
   a second transistor device of the predetermined conductivity type,
   wherein the first transistor device is integrated in a first semiconductor body and comprises a first load pad at a first surface of the first semiconductor body and a second load pad at a second surface of the first semiconductor body,
   wherein the second transistor device is integrated in a second semiconductor body and comprises a first load pad at a first surface of the second semiconductor body, a second load pad at a second surface of the second semiconductor body, and a control pad at the first surface of the second semiconductor body,
   wherein the first load pad of the second transistor device is mounted to the first load pad of the first transistor device,
   wherein the second load pad of the first transistor device is mounted to an electrically conducting carrier,
   wherein the first load pad of the first transistor device is connected to a first load node of the first transistor device, and
   wherein the first load pad of the second transistor device is connected to a first load node of the second transistor device.

2. The electronic circuit of claim 1,
   wherein the first transistor device is a MOSFET and the second transistor device is a MOSFET, and
   wherein the first load node of the first transistor device and the first load node of the second transistor device are one of a source node and a drain node.

3. The electronic circuit of claim 1,
   wherein the first transistor device further comprises a control pad, and
   wherein the control pad of the second transistor device is mounted to the control pad of the first transistor device.

4. The electronic circuit of claim 1,
   wherein the control pad of the second transistor device is mounted to the first load pad of the first transistor device, so that the first load pad of the first transistor device electrically connects the control pad of the second transistor device and the first load pad of the second transistor device.

5. The electronic circuit of claim 1, wherein the first transistor device further comprises a control pad at the first surface of the first semiconductor body.

6. The electronic circuit of claim 1,
   wherein the first transistor device further comprises a control pad at the second surface of the first semiconductor body, and
   wherein the control pad of the first transistor device is connected to an electrically conducting leg.

7. The electronic circuit of claim 1, wherein the predetermined conductivity type is one of an n-type and a p-type.

8. The electronic circuit of claim 1, wherein the first transistor device further comprises a control pad, the electronic circuit further comprising a drive circuit configured to generate a first drive signal between the control pad of the first transistor device and the first load pad of the first transistor device.

9. The electronic circuit of claim 8, wherein the drive circuit is further configured to receive an input signal and generate the first drive signal based on the input signal.

10. The electronic circuit of claim 8, wherein the drive circuit is further configured to generate a second drive signal between the control pad of the second transistor device and the first load pad of the second transistor device.

11. The electronic circuit of claim 10, wherein the drive circuit is further configured to receive a supply voltage and generate the second drive signal dependent on a polarity of the supply voltage.

12. The electronic circuit of claim 11, wherein the drive circuit is configured to generate the second drive signal such that the second transistor device switches on if the supply voltage has a first polarity, and wherein the drive circuit is configured to generate the second drive signal such that the second transistor device switches off if the supply voltage has a second polarity opposite the first polarity.

13. The electronic circuit of claim 8,
   wherein the drive circuit is integrated in a third semiconductor body, and
   wherein the third semiconductor body is mounted to the first surface of the first semiconductor body.

14. The electronic circuit of claim 13, wherein the third semiconductor body is mounted to the first surface of the first semiconductor body spaced apart from the control pad of the first transistor device and the first load pad of the first transistor device.

15. The electronic circuit of claim 8, wherein the drive circuit is integrated in the first semiconductor body.

16. The electronic circuit of claim 1,
wherein the first transistor device further comprises a control pad,
wherein the first transistor device is a MOSFET, wherein the control pad of the first transistor device is a gate pad, the first load pad of the first transistor device is a source pad, and the second load pad of the first transistor device is a drain pad, and
wherein the second transistor device is a MOSFET, wherein the control pad of the second transistor device is a gate pad, the first load pad of the second transistor device is a source pad, and the second load pad of the second transistor device is a drain pad.

17. The electronic circuit of claim 1, wherein the first semiconductor body and the second semiconductor body are integrated in a housing.

18. An electronic circuit, comprising:
a first transistor device of a predetermined conductivity type, wherein the first transistor device is integrated in a first semiconductor body and comprises a first load pad at a first surface of the first semiconductor body, a second load pad at a second surface of the first semiconductor body, and a control pad;
a second transistor device of the predetermined conductivity type, wherein the second transistor device is integrated in a second semiconductor body and comprises a first load pad at a first surface of the second semiconductor body, a second load pad at a second surface of the second semiconductor body, and a control pad; and
a drive circuit configured to:
generate a first drive signal between the control pad of the first transistor device and the first load pad of the first transistor device; and
generate a second drive signal between the control pad of the second transistor device and the first load pad of the second transistor device,
wherein the first load pad of the second transistor device is mounted to the first load pad of the first transistor device,
wherein the second load pad of the first transistor device is mounted to an electrically conducting carrier,
wherein the first load pad of the first transistor device is connected to a first load node of the first transistor device, and
wherein the first load pad of the second transistor device is connected to a first load node of the second transistor device.

19. An electronic circuit, comprising:
a first transistor device of a predetermined conductivity type, wherein the first transistor device is integrated in a first semiconductor body and comprises a first load pad at a first surface of the first semiconductor body, a second load pad at a second surface of the first semiconductor body, and a control pad;
a second transistor device of the predetermined conductivity type, wherein the second transistor device is integrated in a second semiconductor body and comprises a first load pad at a first surface of the second semiconductor body, and a second load pad at a second surface of the second semiconductor body; and
a drive circuit integrated in a third semiconductor body and configured to generate a first drive signal between the control pad of the first transistor device and the first load pad of the first transistor device,
wherein the third semiconductor body is mounted to the first surface of the first semiconductor body,
wherein the first load pad of the second transistor device is mounted to the first load pad of the first transistor device,
wherein the second load pad of the first transistor device is mounted to an electrically conducting carrier,
wherein the first load pad of the first transistor device is connected to a first load node of the first transistor device, and
wherein the first load pad of the second transistor device is connected to a first load node of the second transistor device.

20. The electronic circuit of claim 19, wherein the third semiconductor body is mounted to the first surface of the first semiconductor body spaced apart from the control pad of the first transistor device and the first load pad of the first transistor device.

* * * * *